United States Patent
Hsu et al.

(10) Patent No.: US 7,815,442 B2
(45) Date of Patent: Oct. 19, 2010

(54) BURN-IN SOCKET WITH IMPROVED CONTACTS

(75) Inventors: Hsiu-Yuan Hsu, Tu-Cheng (TW); Chun-Fu Lin, Tu-Cheng (TW); Ke-Hao Chen, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/494,336

(22) Filed: Jun. 30, 2009

(65) Prior Publication Data
US 2009/0325402 A1 Dec. 31, 2009

(30) Foreign Application Priority Data
Jun. 30, 2008 (TW) ............... 97211556 U

(51) Int. Cl.
*H01R 12/00* (2006.01)
(52) U.S. Cl. ........................... 439/71; 439/66
(58) Field of Classification Search ............ 439/66, 439/70, 71, 74, 862
See application file for complete search history.

(56) References Cited

U.S. PATENT DOCUMENTS

| 5,685,725 A | 11/1997 | Uratsuji |
| 6,283,780 B1 * | 9/2001 | Yamamoto et al. ........ 439/266 |
| 7,097,463 B2 * | 8/2006 | Hsiao et al. ............... 439/70 |
| 7,234,947 B2 * | 6/2007 | Alger et al. ............... 439/71 |

* cited by examiner

*Primary Examiner*—Khiem Nguyen
(74) *Attorney, Agent, or Firm*—Andrew C. Cheng; Wei Te Chung; Ming Chieh Chang

(57) ABSTRACT

A burn-in socket for electrical connecting with package having solder balls, includes a base and a number of contacts received in the base. Each contact has a spring section movable in the base, a contact section extending upwardly from the spring section and a retention section extending downwardly from the spring section. The contact section includes three tips at a top end thereof for contacting with the solder balls of the package thereby supporting the solder balls.

7 Claims, 5 Drawing Sheets

BURN-IN SOCKET WITH IMPROVED CONTACTS

BACKGROUND OF THE INVENTION

1. Field of the Invention

The present invention relates generally to electrical connector, and more particularly to a connector having contacts each has a solder cup for readily receiving a solder ball therein.

2. Description of Related Art

Electronic packages, such as integrated circuits (ICs), are miniaturized electronic devices, in which a number of active and passive circuit elements are located on or within a continuous body of material to perform the function of a complete circuit. To ensure reliability in use, the ICs require prior burning-in to test their durability as well as performance. The ICs are run at high temperature for an extended period of time to accelerate invalidation of ICs with disfigurements. This helps elimination of early product failures once the ICs are sold and/or assembled onto electronic end devices. A burn-in socket assembly is used to receive an IC therein, and electrically connects the IC with a burn-in board for operation of the IC at high temperature.

A conventional burn-in socket, such as shown in U.S. Pat. No. 5,688,725 issued to Uratsuji on Nov. 11, 1997, comprises a base, a plurality of contacts secured to the base, an operating plate, and a damping plate. Generally, the contacts includes a curve spring section, a contacting section upwardly extending from the spring section, a retention section extending from the spring section, and a tail section extending downwardly from the retention section. During test, the IC is provided a plurality of solder balls and the contact sections of the burn-in socket contact with the solder balls. Since the contact section is configured as a sheet which escapes from a bottom end of the solder ball and will not engage with the solder balls reliably.

Hence, it is desired an improved burn-in socket to overcome the problems mentioned above.

BRIEF SUMMARY OF THE INVENTION

Accordingly, an object of the present invention is to provide a burn-in socket with contacts reliably contacting with the IC package.

In order to obtain the object, a burn-in socket for electrical connecting with package with solder balls, comprises a base and a plurality of contacts received in the base. Each contact comprises a spring section movable in the base, a contact section extending upwardly from the spring section and a retention section extending downwardly from the spring section. The contact section includes three tips at a top end thereof for contacting with the solder balls of the package thereby supporting the solder balls of the package.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
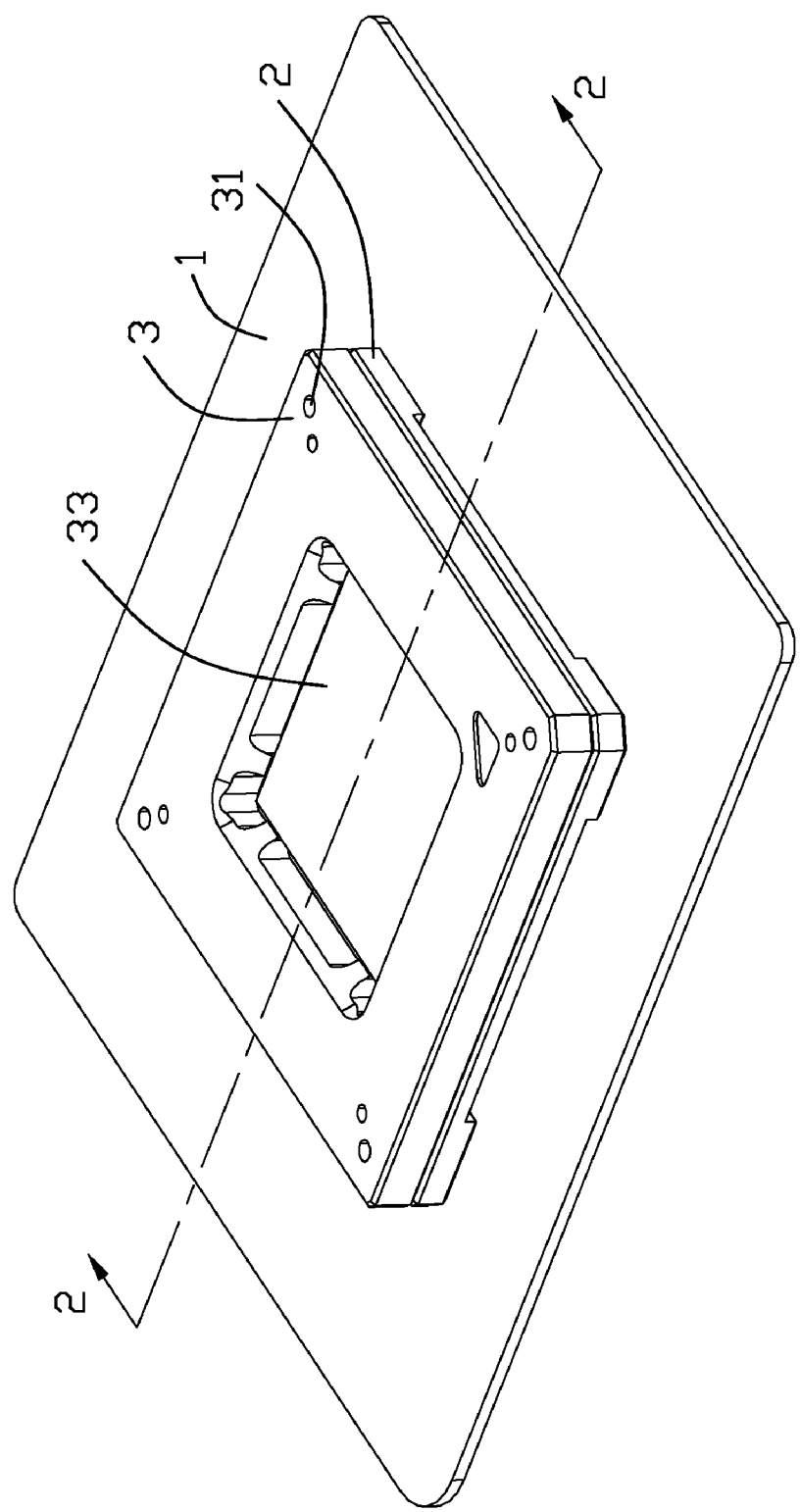
FIG. 1 is a perspective view of an electrical connector according to a preferred embodiment of the present invention.

Reference will be made to the drawing figures to describe the present invention in detail, wherein depicted elements are not necessarily shown to scale and wherein like of similar elements are designated by same or similar reference numeral through the several views and same or similar terminology.

Referring to FIGS. 1-4, the present invention is directed to a burn-in socket for electrical connected a IC package 33 to a printed circuit board 2. The burn-in socket includes a base 2, a plurality of contacts 4 secured on the base 2, a frame 3 mounted to the base 2, and a bottom plate 5 under the printed circuit board 1 for securing to the base 2.

Figure 2:
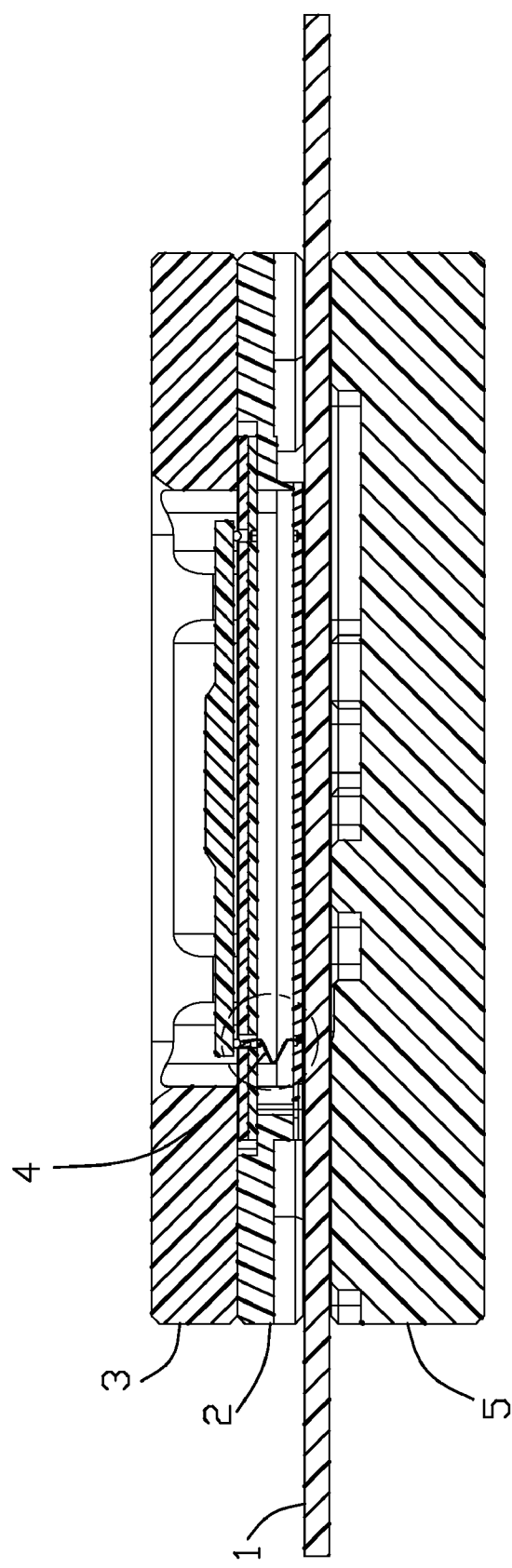
FIG. 2 is a cross-sectional view of the electrical connector taken along line 4-4 shown in FIG. 1.
Figure 3:
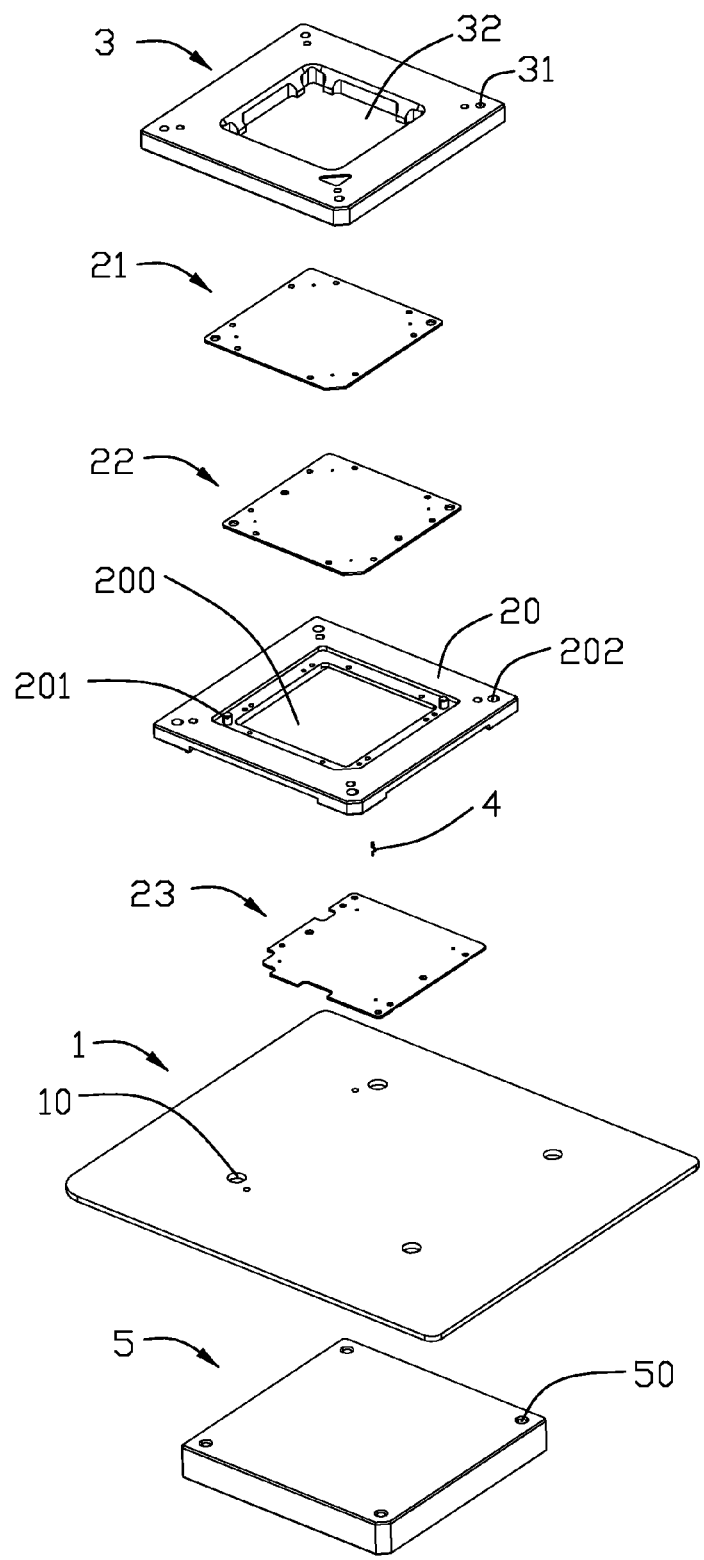
FIG. 3 is an exploded view of the electrical connector shown in FIG. 1.

Please referring to FIGS. 1 and 2, the base 2 is seated on the printed circuit board 1 and comprises a main body 20, a positioning plate 21, a clip plate 22 and a retention plate 23. The main body 20 defines a receiving space 200 with posts 201 located at corners thereof and screw holes 202 extending through the main body 200. The positioning plate 21 and the clip plate 22 are received in the receiving space 200 with the positioning plate 21 over the clip plate 22. The retention plate 23 is mounted to a bottom face of the main body and located under the receiving space 200. The positioning plate 21, clip plate 22, and retention plate 23 are all secured to the main body 20 by screw (not shown) and each comprising a plurality of passageways 211, 221, 231 corresponding to the contacts 4 respectively.

Referring to FIGS. 1 and 2, the frame 3 is located on the main body 20 and defines an opening 32 for accommodating the IC package 33. The IC package 33 is provided with a plurality of solder balls at bottom end thereof. Please further referring to FIG. 3, the frame 3 defines a plurality of through holes 31 at corners thereof. The printed circuit board 1 and the bottom plate 5 each defines a plurality of holes 10, 50 corresponding to the through holes 31 and the screw hole 202. A plurality of screws (not shown) extend through the holes 21, 202, 10, 50 in turn thereby securing the frame 3, the main body 2, the printed circuit board 1 and the bottom plate 5 together.

Figure 4:
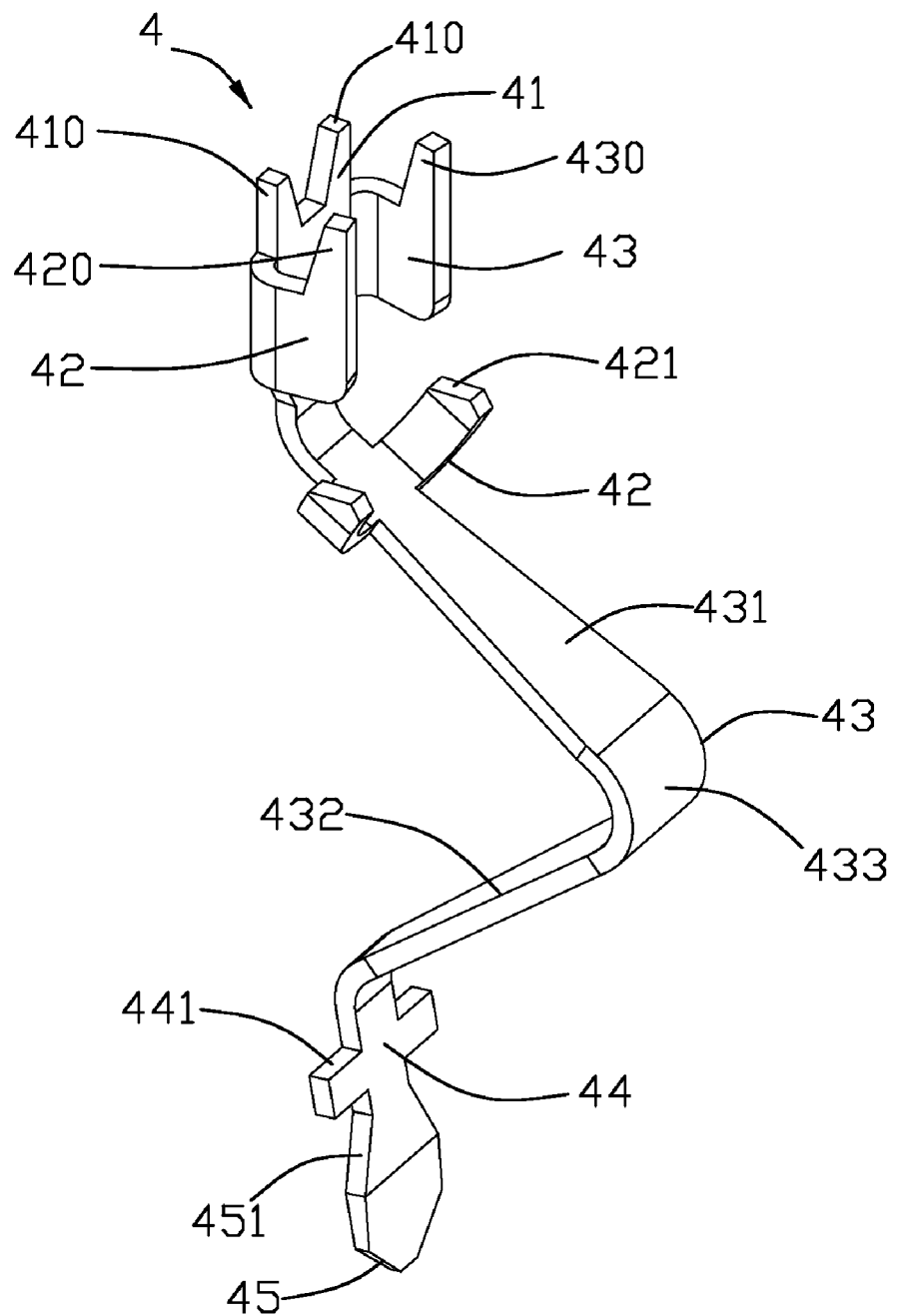
FIG. 4 is a perspective view of an electrical contact.

Please referring to FIG. 4, the contact 4 has a bending spring section 43 which includes a top arm 431, a bottom arm 432, and an arc connecting section 433 located between the top and bottom arm 431, 432 thereby providing a vertical movement of the contact 4. The top and bottom arms 431, 432 turn to thinner at the section far from the connecting section 433. The top and bottom arm 431, 432 defines a closed angle less than 90 degree. The contact 4 further includes a retention section 42 at top end of the top arm 431 and a latch section 44 extending downwardly from the spring section 43. The retention section 42 and the latch section 44 each has a pair of shoulders 421, 441 and the shoulder 421 is perpendicular to the retention section 42, and the shoulder 441 is extending laterally from the latch section 44. A tail section 45 is provided below the latch section 44 via a transition section 451 and received in the passageways 231 of the retention plate 23.

A contact section 31 is formed on the top end of the contact 4 and comprises a first tip 41, a second and third tip 42, 43 located at opposite sides of the first tip 41. The first tip 41 forms two contact points 410 to contact with the solder ball 331 and the second and third tip 42, 43 each forms a contact point 420, 430 to contact with the solder ball 331. Therefore, the single contact 4 can provide more than two contact points supporting and contacting with the solder ball 331 whereby the solder ball 331 not only can be well positioned on the contact 4 but also has a reliable electrical connection with the contact 4.

Figure 5:
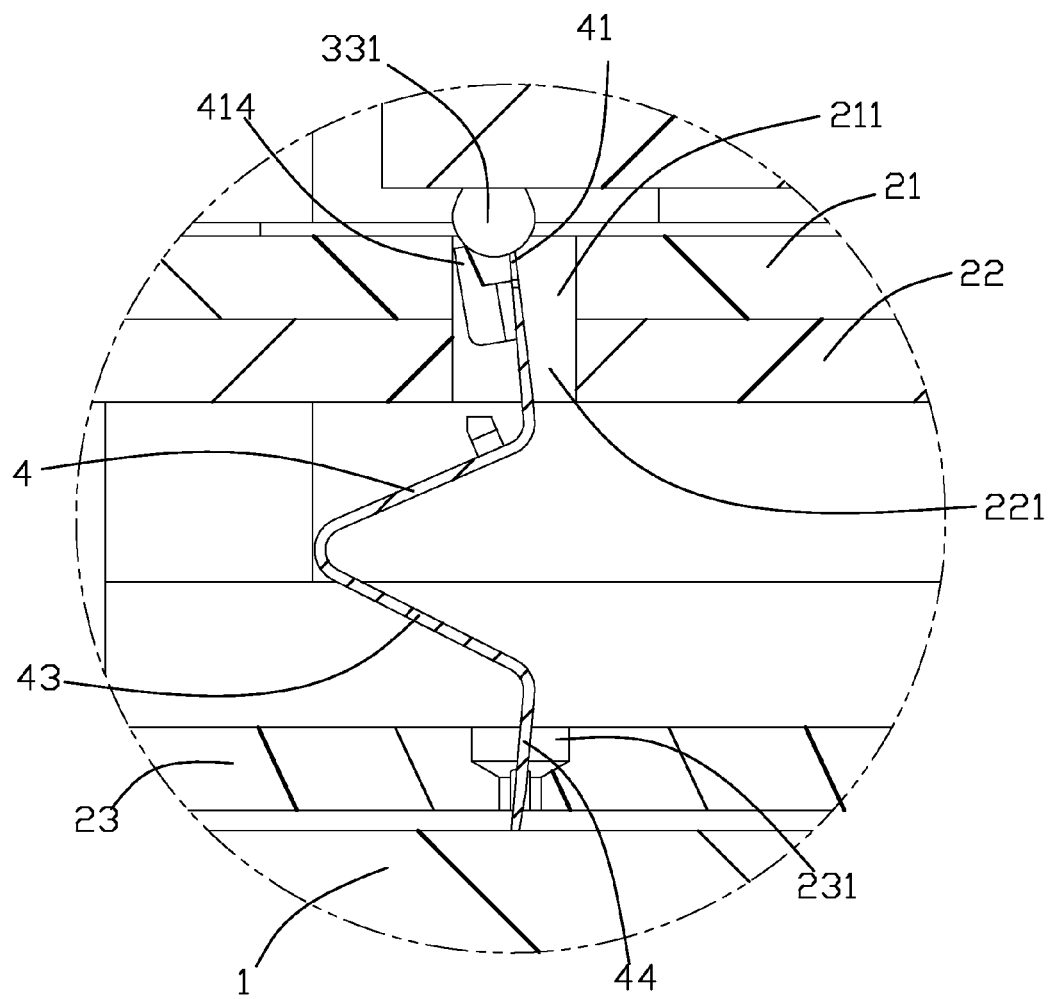
FIG. 5 is enlarged view of the circle portion shown in FIG. 2.

Please referring to FIG. 5, which shows the IC package 33 is pressed downwardly on the burn-in socket, the solder ball 331 is received in the passageway 211 and contact with the contact 4. The contact points 410, 420, 430 support the solder ball 331 and position the solder ball in the passageway 211. Therefore, the contact section 31 defines a solder-cup by the tips 41, 42, 43 thereof for substantially receiving portion of solder ball 331 therein and contacting with the solder ball 331 simultaneously Although the present invention has been described with reference to particular embodiments, it is not to be construed as being limited thereto. Various alterations and modifications can be made to the embodiments without in any way departing from the scope or spirit of the present invention as defined in the appended claims.

We claim:

1. A burn-in socket for electrical connecting with package with solder balls, comprising: a base; and a plurality of contacts received in the base and each comprising a spring section movable in the base, a contact section extending upwardly from the spring section and a retention section extending downwardly from the spring section, the contact section including a solder-cup defined by three tips of the contacts for substantially receiving portion of solder ball therein, the tips contacting with the solder ball simultaneously, wherein the three tips are first, second an third tip; and wherein the second and third tip are bent from the first tip and located at opposite sides of the first tip, wherein the first tip forms two contact points contacting with the solder ball, and the second and third tips each form a contact points contacting with the solder ball, wherein the base comprises a main body, a positioning plate, and a clip plate; and the main body defines a receiving space for receiving the positioning plate and the clip plate therein, wherein the spring section includes a top arm, a bottom arm, and an arc connecting section located between the top and bottom arm thereby providing a vertical movement of the contact.

2. The burn-in socket as claimed in claim 1, wherein the positioning plate and the clip plate are secured to the main body and each defines a plurality of passageways corresponding to the contacts, respectively.

3. The burn-in socket as claimed in claim 2, wherein the spring sections are received in the main body and the contact sections are received in the passageways of the positioning plate and the clip plate.

4. The burn-in socket as claimed in claim 1, wherein the base further comprises a retention plate mounted to a bottom face of the main body, and the retention plate defines a plurality of passageways for receiving the retention sections of the contacts therein.

5. A burn-in socket for electrical connecting with package with solder balls, comprising: a base; a frame seated on the base and defining an opening for receiving the package; and a plurality of contacts secured to the base and each comprising a spring section movable in the base, a contact section extending upwardly from the spring section and a retention section extending downwardly from the spring section, the contact section including three tips received in the base and contacting with the solder balls of the package, wherein the three tips are configured first, second an third tip; and wherein the second and third tip are bent from the first tip and located at opposite sides of the first tip, wherein the first tip has two contact points contacting with the solder ball, and the second and third tip each has a contact points contacting with the solder ball, wherein the base comprises a main body, a positioning plate, and a clip plate; and the main body defines a receiving space for receiving the positioning plate and the clip plate therein, wherein the spring section includes a top arm, a bottom arm, and an arc connecting section connecting therewith, and the top and bottom arm defines a closed angle.

6. The burn-in socket as claimed in claim 5, wherein the positioning plate and the clip plate are secured to the main body and each defines a plurality of passageways corresponding to the contacts, respectively.

7. The burn-in socket as claimed in claim 6, wherein the spring sections are received in the main body and the contact sections are received in the passageways of the positioning plate and the clip plate.

* * * * *